US012785707B2

(12) United States Patent
Melanson et al.

(10) Patent No.: US 12,785,707 B2
(45) Date of Patent: *Nov. 3, 2026

(54) CIRCUITRY COMPRISING A LOOP FILTER

(71) Applicant: Cirrus Logic International Semiconductor Ltd., Edinburgh (GB)

(72) Inventors: John L. Melanson, Austin, TX (US); Eric J. King, Austin, TX (US); Thomas H. Hoff, Austin, TX (US); Lingli Zhang, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 140 days.

This patent is subject to a terminal disclaimer.

(21) Appl. No.: 18/824,537

(22) Filed: Sep. 4, 2024

(65) Prior Publication Data

US 2024/0429929 A1 Dec. 26, 2024

Related U.S. Application Data

(63) Continuation of application No. 17/898,635, filed on Aug. 30, 2022, now Pat. No. 12,119,834.

(60) Provisional application No. 63/275,131, filed on Nov. 3, 2021.

(51) Int. Cl.
*H03M 1/06* (2006.01)
*H03M 1/82* (2006.01)

(52) U.S. Cl.
CPC ....... *H03M 1/0626* (2013.01); *H03M 1/0612* (2013.01); *H03M 1/822* (2013.01)

(58) Field of Classification Search
CPC .. H03M 1/0626; H03M 1/0612; H03M 1/822; H03M 3/42; H03M 3/452; H03M 3/506; H03F 3/2175
See application file for complete search history.

(56) References Cited

U.S. PATENT DOCUMENTS

| | | | | |
|---|---|---|---|---|
| 8,736,473 | B2 * | 5/2014 | Dijkmans | H03M 3/434 341/143 |
| 2010/0315275 | A1 | 12/2010 | Murahashi | |
| 2011/0102223 | A1 | 5/2011 | Kinyua et al. | |
| 2013/0127531 | A1 | 5/2013 | Lesso | |
| 2022/0217026 | A1 * | 7/2022 | Bandyopadhyay | H04L 27/01 |

OTHER PUBLICATIONS

Invitation to Pay Additional Fees, Partial International Search, and Provisional Opinion, International Application No. PCT/GB2022/052573, mailed Jan. 20, 2023.

Matamura, Atsushi et al., “An 82-mW Δ Σ-Based Filter-Less Class-D Headphone Amplifier with -93-dB THD+N, 113-dB SNR, and 93% Efficiency”, IEEE Journal of Solid-State Circuits, vol. 56, No. 12, Dec. 2021, pp. 3573-3582.

* cited by examiner

*Primary Examiner* — Khai M Nguyen
(74) *Attorney, Agent, or Firm* — Jackson Walker L.L.P.

(57) ABSTRACT

Pulse width modulation (PWM) driver circuitry comprising: a loop filter configured to receive an analog input signal and to output a digital loop filter output signal based on the analog input signal and an analog feedback signal; and a PWM modulator configured to receive a digital signal based on the digital loop filter output signal and to output a PWM signal, wherein the PWM driver circuitry further comprises a feedback path coupled to an output of the PWM driver circuitry for the analog feedback signal.

24 Claims, 10 Drawing Sheets

CIRCUITRY COMPRISING A LOOP FILTER

The present disclosure is a continuation of U.S. Non-Provisional patent application Ser. No. 17/898,635, filed Aug. 30, 2022, which claims benefit to U.S. Provisional Patent Application No. 63/275,131, filed Nov. 3, 2021, each of which is incorporated by reference herein in its entirety.

FIELD OF THE INVENTION

The present disclosure relates to circuitry comprising a loop filter, and to a hybrid loop filter configured to receive an analog input signal and an analog feedback signal and to output a digital output signal.

BACKGROUND

Many closed-loop electronic circuits include a loop filter to regulate the response of the electronic circuit to changes (e.g., transients) in the input or output signals of the circuit. In such circuits a feedback path is provided for feeding back a portion of the output signal, which is subtracted from the input signal to generate an error signal. This error signal is received by the loop filter, which typically integrates the error signal to generate a filtered output signal. The bandwidth of the loop filter determines the speed of the loop filter's response to a change in the input signal or the output signal; in general, the speed of the response is proportional to the bandwidth of the loop filter, such that a lower bandwidth loop filter will give rise to a slower transient response than a higher bandwidth loop filter.

FIG. 1 is a schematic representation of example pulse width modulation (PWM) driver circuitry for driving a load, e.g., an audio load such as a speaker or other audio transducer, which includes an analog loop filter. The circuitry, shown generally at 100 in FIG. 1, includes digital to analog converter (DAC) circuitry 110 configured to receive a digital input signal (which may be, for example, a digital audio signal) and convert it to an analog output signal.

The analog output signal from the DAC circuitry 110 is received at a first analog summing node 120, which subtracts a feedback signal from the analog DAC output signal and outputs an analog error signal to analog loop filter circuitry 130.

The analog loop filter circuitry 130 outputs a filtered version of the error signal to analog PWM circuitry 140.

The PWM circuitry 140 generates a PWM output signal based on the signal received from the analog loop filter circuitry 130, and this PWM output signal is output to power driver circuitry 150, which generates and outputs a drive signal for driving a load 160.

An analog feedback path 170 feeds a portion of the drive signal back to the first analog summing node 120 as a feedback signal.

In some examples, the circuitry 100 may include an analog feedforward path 180, coupled to the output of the DAC circuitry 110 so as to receive a portion of the analog signal output by the DAC circuitry 110. The analog feedforward path 180 may include an analog gain element 182 configured to apply an analog gain to the signal in the analog feedforward path 180, and the resulting analog feedforward signal is output to a second analog summing node 184, which is operative to add the feedforward signal to the signal output by the analog loop filter circuitry 130, such that the signal received by the PWM circuitry 140 is a combination of the signal output by the analog loop filter circuitry 130 and the analog feedforward signal.

SUMMARY

According to a first aspect, the invention provides pulse width modulation (PWM) driver circuitry comprising:

a loop filter configured to receive an analog input signal and to output a digital loop filter output signal based on the analog input signal and an analog feedback signal; and a PWM modulator configured to receive a digital signal based on the digital loop filter output signal and to output a PWM signal, wherein the PWM driver circuitry further comprises a feedback path coupled to an output of the PWM driver circuitry for the analog feedback signal.

The PWM driver circuitry may further comprise a digital feedforward path configured to receive a digital input signal and to output a digital feedforward signal, wherein the digital signal received by the PWM modulator signal is based on the digital loop filter output signal and the digital feedforward signal.

The PWM driver circuitry may further comprise a power driver configured to receive the PWM signal output by the PWM modulator and to generate a drive signal for driving a load coupled to the PWM driver circuitry.

An output of the power driver may be coupled to the output of the PWM driver circuitry, such that the feedback path for the analog feedback signal receives the drive signal.

The power driver may comprise multi-level converter (MLC) circuitry.

The PWM driver circuitry may further comprise a digital feedforward path configured to receive a digital input signal and to output a digital feedforward signal, wherein the digital signal received by the PWM modulator signal is based on the digital loop filter output signal and the digital feedforward signal, wherein the digital feedforward path comprises a digital correction element configured to apply a correction to a signal in the digital feedforward path to correct or compensate, at least partially, for error introduced by the power driver and/or the load.

The digital correction element may comprise one or more of:

a digital gain element for applying a digital gain to the signal in the digital feedforward path; and an adaptive digital filter.

The PWM driver circuitry may further comprise input digital to analog converter (DAC) circuitry configured to receive a digital input signal and to output the analog input signal to the loop filter.

The loop filter may comprise analog integrator circuitry and analog to digital converter circuitry.

The loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

third analog integrator circuitry having an input coupled to an output of the second analog integrator circuitry, the third analog integrator circuitry configured to output a third integrated analog output signal;

a first analog signal path having an input coupled to the output of the first analog integrator circuitry, the first analog signal path comprising a first analog correction element;

a second analog signal path having an input coupled to the output of the second analog integrator circuitry, the second analog signal path comprising a second analog correction element;

a third analog signal path having an input coupled to the output of the third analog integrator circuitry, the third analog signal path comprising a third analog correction element;

an analog summing node configured to receive output signals of the first, second and third analog signal paths and to output a combined analog output signal; and analog to digital converter circuitry coupled to an output of the analog summing node and configured to convert the combined analog output signal into the digital loop filter output signal.

The loop filter may further comprise digital integrator circuitry.

The loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

a first analog signal path having an input coupled to the output of the first analog integrator circuitry, the first analog signal path comprising a first analog correction element;

a second analog signal path having an input coupled to an output of the second analog integrator circuitry, the second analog signal path comprising a second analog correction element;

an analog summing node configured to receive output signals of the first and second analog signal paths and to output a combined analog output signal;

analog to digital converter (ADC) circuitry coupled to an output of the analog summing node and configured to convert the combined analog output signal into an intermediate digital output signal;

digital integrator circuitry coupled to an output of the ADC circuitry to receive the intermediate digital output signal, the digital integrator circuitry configured to output an integrated digital signal;

a digital signal path having an input coupled to the output of the ADC circuitry, the digital signal path comprising a digital correction element; and a digital summing node configured to combine the integrated digital signal with an output signal from the digital signal path to generate the digital loop filter output signal.

The loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

first analog to digital converter (ADC) circuitry having an input coupled to the output of the second analog integrator circuitry;

second analog to digital converter (ADC) circuitry having an input coupled to an output of the first analog integrator circuitry;

digital integrator circuitry configured to receive a digital signal output by the first ADC circuitry and to output an integrated digital signal;

a digital signal path having an input coupled to an output of the first ADC circuitry, the digital signal path comprising a digital correction element; and a digital summing node configured to combine the integrated digital signal with an output signal from the digital signal path to generate the digital loop filter output signal.

A sampling rate of the first ADC circuitry may be different from a sampling rate of the second ADC circuitry.

The loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

third analog integrator circuitry having an input coupled to an output of the second analog integrator circuitry, the third analog integrator circuitry configured to output a third integrated analog output signal;

first analog to digital converter (ADC) circuitry having an input coupled to the output of the first analog integrator circuitry;

second analog to digital converter (ADC) circuitry having an input coupled to the output of the second analog integrator circuitry;

third analog to digital converter (ADC) circuitry having an input coupled to an output of the first analog integrator circuitry;

a first digital signal path having an input coupled to the output of the first ADC circuitry, the first digital signal path comprising a first digital correction element;

a second digital signal path having an input coupled to the output of the second ADC circuitry, the second digital signal path comprising a second digital correction element;

a third digital signal path having an input coupled to the output of the third ADC circuitry, the third digital signal path comprising a third digital correction element; and a digital summing node configured to combine output signals of the first, second and third digital signal paths to generate the digital loop filter output signal.

A sampling rate of the first ADC circuitry may be different from a sampling rate of the second ADC circuitry, and/or wherein the sampling rate of the second ADC circuitry may be different from a sampling rate of the third ADC circuitry.

The loop filter may comprise:

first analog integrator circuitry;

second analog integrator circuitry;

multiplexer circuitry having inputs coupled to outputs of the first and second analog integrator circuitry;

analog to digital converter (ADC) circuitry having an input coupled to an output of the multiplexer circuitry;

a first digital signal path comprising a first digital correction element coupled to the output of the ADC circuitry;

a second digital signal path comprising a second digital correction element coupled to the output of the ADC circuitry; and a digital summing node configured to combine output signals of the first and second digital signal paths and output a combined digital signal.

A sampling rate of the ADC circuitry may be variable based on which of the inputs of the multiplexer circuitry is selected by the multiplexer circuitry.

According to a second aspect, the invention provides a hybrid loop filter comprising:

an input for receiving an analog input signal;

an analog integrator for receiving the analog input signal and generating an integrated analog signal; and an analog to digital converter for converting the integrated analog signal into a digital loop filter output signal.

The hybrid loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

third analog integrator circuitry having an input coupled to an output of the second analog integrator circuitry, the third analog integrator circuitry configured to output a third integrated analog output signal;

a first analog signal path having an input coupled to the output of the first analog integrator circuitry, the first analog signal path comprising a first analog correction element;

a second analog signal path having an input coupled to the output of the second analog integrator circuitry, the second analog signal path comprising a second analog correction element;

a third analog signal path having an input coupled to the output of the third analog integrator circuitry, the third analog signal path comprising a third analog correction element;

an analog summing node configured to receive output signals of the first, second and third analog signal paths and to output a combined analog output signal; and analog to digital converter circuitry coupled to an output of the analog summing node and configured to convert the combined analog output signal into the digital loop filter output signal.

The hybrid loop filter may further comprise digital integrator circuitry.

The hybrid loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

a first analog signal path having an input coupled to the output of the first analog integrator circuitry, the first analog signal path comprising a first analog correction element;

a second analog signal path having an input coupled to an output of the second analog integrator circuitry, the second analog signal path comprising a second analog correction element;

an analog summing node configured to receive output signals of the first and second analog signal paths and to output a combined analog output signal;

analog to digital converter (ADC) circuitry coupled to an output of the analog summing node and configured to convert the combined analog output signal into an intermediate digital output signal;

digital integrator circuitry coupled to an output of the ADC circuitry to receive the intermediate digital output signal, the digital integrator circuitry configured to output an integrated digital signal;

a digital signal path having an input coupled to the output of the ADC circuitry, the digital signal path comprising a digital correction element; and a digital summing node configured to combine the integrated digital signal with an output signal from the digital signal path to generate the digital loop filter output signal.

The hybrid loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

first analog to digital converter (ADC) circuitry having an input coupled to the output of the second analog integrator circuitry;

second analog to digital converter (ADC) circuitry having an input coupled to an output of the first analog integrator circuitry;

digital integrator circuitry configured to receive a digital signal output by the first ADC circuitry and to output an integrated digital signal;

a digital signal path having an input coupled to an output of the first ADC circuitry, the digital signal path comprising a digital correction element; and a digital summing node configured to combine the integrated digital signal with an output signal from the digital signal path to generate the digital loop filter output signal.

The hybrid loop filter may comprise:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

third analog integrator circuitry having an input coupled to an output of the second analog integrator circuitry, the third analog integrator circuitry configured to output a third integrated analog output signal;

first analog to digital converter (ADC) circuitry having an input coupled to the output of the first analog integrator circuitry;

second analog to digital converter (ADC) circuitry having an input coupled to the output of the second analog integrator circuitry;

third analog to digital converter (ADC) circuitry having an input coupled to an output of the first analog integrator circuitry;

a first digital signal path having an input coupled to the output of the first ADC circuitry, the first digital signal path comprising a first digital correction element;

a second digital signal path having an input coupled to the output of the second ADC circuitry, the second digital signal path comprising a second digital correction element;

a third digital signal path having an input coupled to the output of the third ADC circuitry, the third digital signal path comprising a third digital correction element; and a digital summing node configured to combine output signals of the first, second and third digital signal paths to generate the digital loop filter output signal.

The hybrid loop filter may comprise:

first analog integrator circuitry;

second analog integrator circuitry;

multiplexer circuitry having inputs coupled to outputs of the first and second analog integrator circuitry;

analog to digital converter (ADC) circuitry having an input coupled to an output of the multiplexer circuitry;

a first digital signal path comprising a first digital correction element coupled to the output of the ADC circuitry;

a second digital signal path comprising a second digital correction element coupled to the output of the ADC circuitry; and a digital summing node configured to combine output signals of the first and second digital signal paths and output a combined digital signal.

According to a third aspect, the invention provides an integrated circuit comprising PWM driver circuitry according to the first aspect.

According to a fourth aspect, the invention provides an integrated circuit comprising a hybrid loop filter according to the second aspect.

According to a fifth aspect, the invention provides a host device comprising a hybrid loop filter according to the second aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
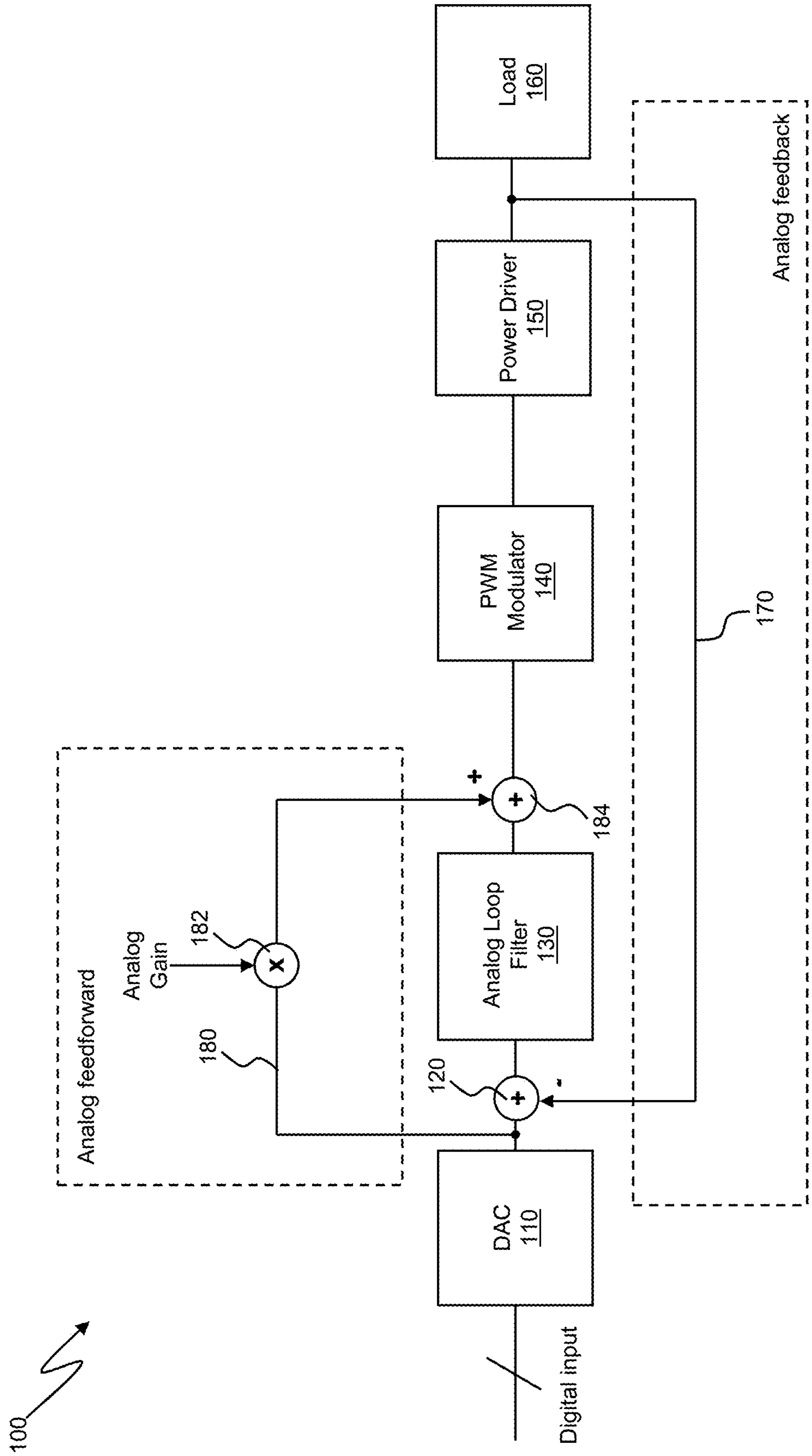
FIG. 1 is a schematic representation of example PWM driver circuitry, including an analog loop filter, for driving a load.
Figure 2A:
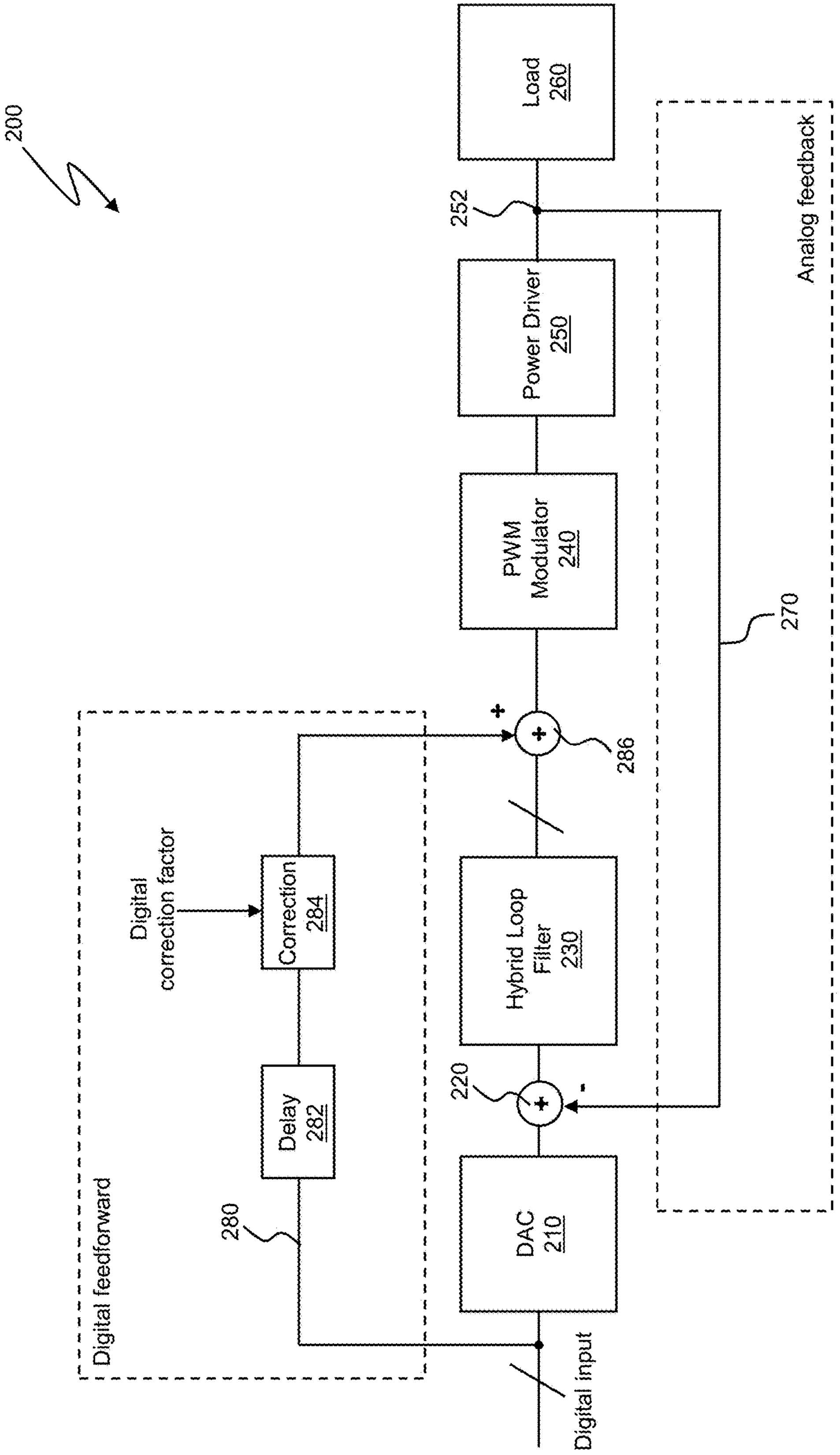
FIGS. 2*a*-2*c* are schematic representations of example PWM driver circuitry, including a hybrid loop filter, for driving a load.

FIG. 2*a* is a schematic representation of example PWM driver circuitry including a hybrid loop filter according to the present disclosure. In this example the PWM driver circuitry, shown generally at 200, is for driving a load, e.g. an audio load such as a speaker or other audio transducer, but it is to be appreciated that the PWM driver circuitry and the hybrid loop filter of the present disclosure are suitable for a wide variety of applications, for example PWM-based Class D audio amplifier circuitry, PWM-based motor controller circuitry, PWM-based power converter (e.g. DC-DC converter) circuitry etc.

The PWM driver circuitry 200 includes digital to analog converter (DAC) circuitry 210 configured to receive a digital input signal (which may be, for example, a digital audio signal) and convert it to an analog DAC output signal.

The analog DAC output signal is received at a first, analog, summing node 220, which subtracts a feedback signal from the analog DAC output signal and outputs an analog error signal to hybrid loop filter circuitry 230.

As will be described in more detail below, the hybrid loop filter circuitry 230 comprises analog filter circuitry and analog to digital converter (ADC) circuitry, such that the hybrid loop filter circuitry 230 is configured to receive an analog input signal and to output a digital loop filter output signal.

The hybrid loop filter circuitry 230 outputs a filtered, digitised version of the error signal to digital PWM modulator circuitry 240.

The digital PWM modulator circuitry 240 generates a PWM output signal based on the digital loop filter output signal received from the hybrid loop filter circuitry 230, and this PWM output signal is output to power driver circuitry 250, which generates and outputs a drive signal for driving a load 260 coupled to an output node or terminal 252 of the PWM driver circuitry 200.

In some examples, multi-level converter (MLC) power driver circuitry is configured to generate an output signal that can adopt a plurality of different levels. The output signal level adopted by the MLC power driver circuitry may vary according to a desired output signal level at the load 260, for example. The MLC circuitry may be configured to provide any suitable number of output levels. In some examples the power driver circuitry 250 may comprise MLC circuitry configured to provide 5 or more output voltage levels.

An analog feedback path 270 coupled to the output node or terminal 252 feeds a portion of the drive signal back to the first summing node 220 as a feedback signal. In the example PWM driver circuitry 200 of FIG. 2, the power driver circuitry 250 is coupled directly to the load 260, which is separate from the PWM driver circuitry 200 (e.g., is external to integrated circuitry that implements the PWM driver circuitry 200). However, it will be appreciated by those of ordinary skill in the art that in some implementations additional circuitry 290 may be provided between the power driver circuitry 250 and the load 260. Examples of such implementations are shown in FIGS. 2*b* and 2*c*.

For example, filter circuitry may be provided between the power driver circuitry 250 and the load 260 to filter the drive signal output by the power driver circuitry 250 and output a filtered version of the drive signal to the load 260, such that the load 260 need not perform any filtering on the drive signal. Such filter circuitry may form part of the PWM driver circuitry 200 (e.g., may be integrated with the other circuitry of the PWM driver circuitry 200 in one or more integrated circuits), as shown in FIG. 2*b* or may be external to the PWM driver circuitry 200, as shown in FIG. 2*c*. In some examples the filter circuitry may comprise one or more ferrite beads coupled between the output of the power driver circuitry 250 and the load 260.

Figure 2B:
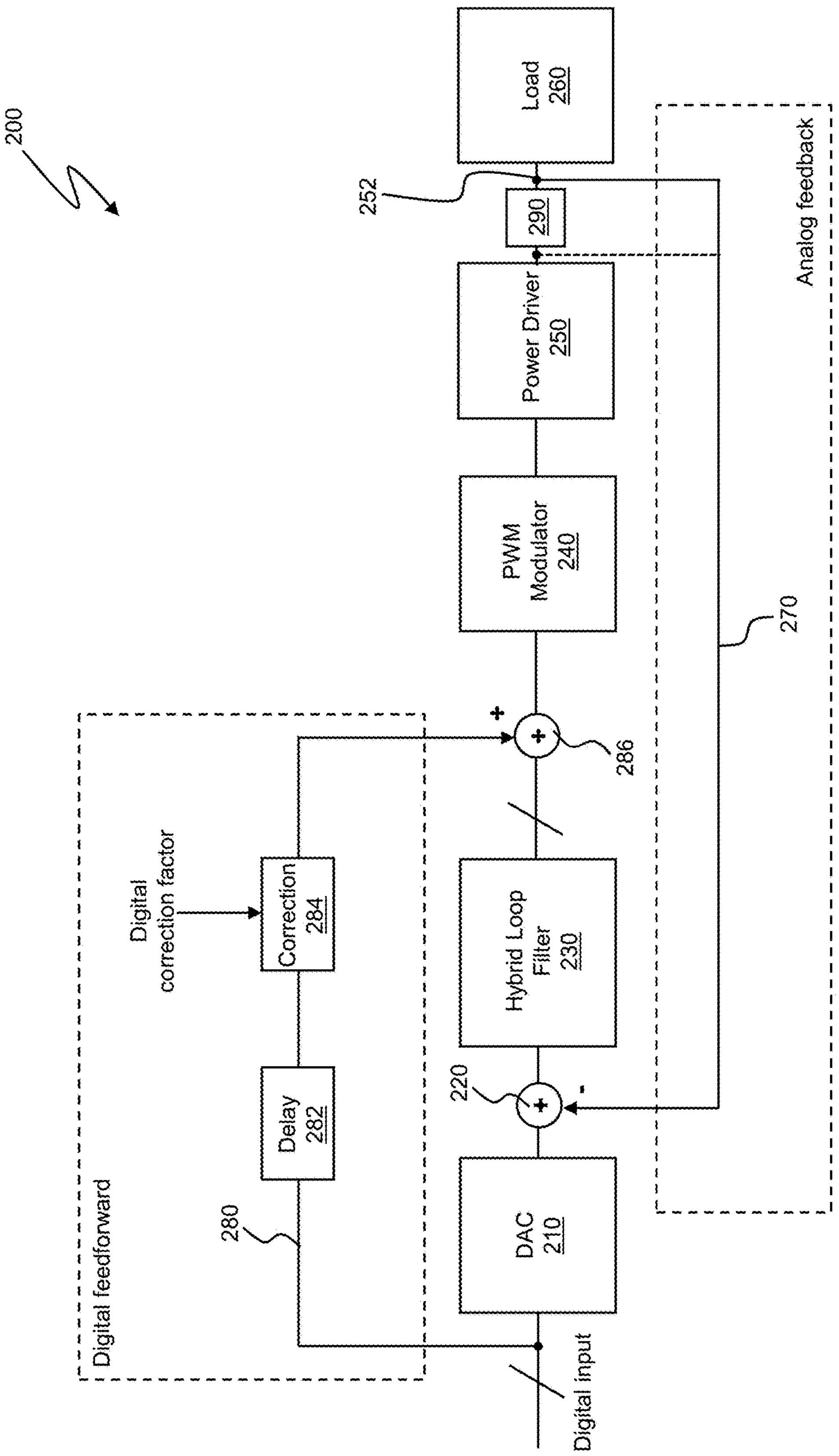
Figure 2C:
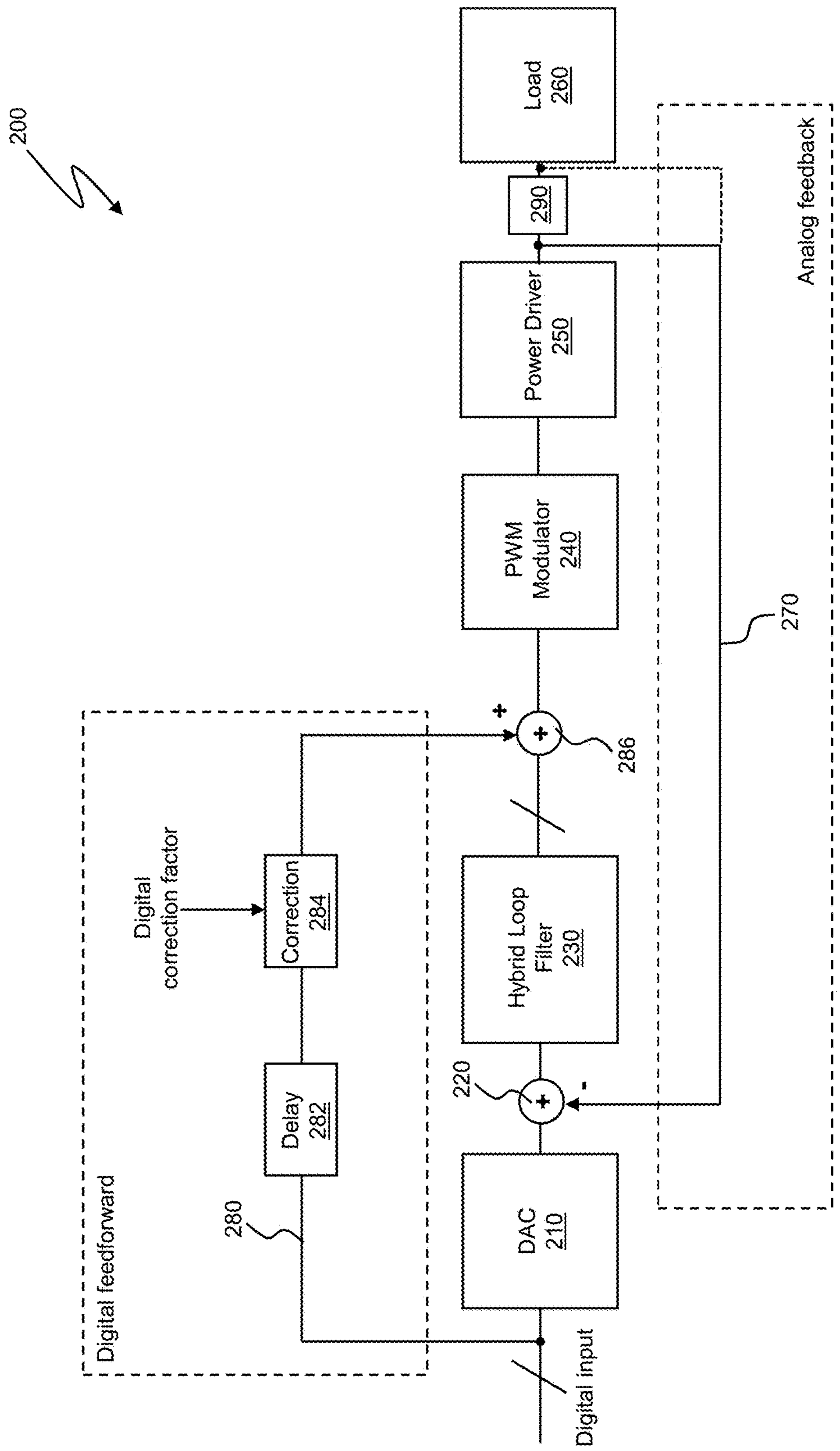

In implementations that include additional circuitry 290 such as filter circuitry between the output of the power driver circuitry 250 and the load 260, the analog feedback path 270 may be coupled to the output of the power driver circuitry 250, as shown in FIG. 2*c*, or alternatively may be coupled to an output of the filter circuitry, as shown in FIG. 2*b*.

Where any such additional circuitry forms part of the PWM driver circuitry 200, the output node or terminal 252 will be coupled to the output of the additional circuitry 290, and the analog feedback path 270 may be coupled to either the output of the power driver circuitry 250 or the output of the additional circuitry.

If the additional circuitry is external to the PWM driver circuitry 200, the output node or terminal 252 of the PWM driver circuitry 200 will be coupled to the output of the power driver circuitry 250, and the analog feedback path 270 may be coupled, in use of the PWM driver circuitry, to either the output of the power driver circuitry 250 or the output of the additional circuitry.

As will be appreciated, regardless of whether or not any additional circuitry 290 is present, the analog feedback path 270 is coupled to an output of the PWM driver circuitry 200, in the sense that the analog feedback path 270 is connected, directly or indirectly (e.g., via the additional circuitry), to the output of the PWM driver circuitry 200.

In some examples, the PWM driver circuitry 200 may include a digital feedforward path 280 coupled to the input side of the DAC circuitry 210 and configured to receive the digital input signal. In the illustrated example the digital feedforward path 280 includes a digital delay element 282, configured to apply a delay to the input digital signal to compensate for latency in the DAC circuitry 210 and the hybrid loop filter circuitry 230, and a digital correction element 284 configured to apply a digital correction to the signal output by the digital delay element 282, to correct or compensate, at least partially, for error introduced by the power driver circuitry 250 and/or the load 260.

The digital correction element 284 may be, for example, a digital gain element that is operative to apply a digital gain to the signal in the digital feedforward path 280 to correct, at least partially, error introduced by the power driver circuitry 250 and/or the load 260. As another example, the digital correction element 284 may be an adaptive digital filter, operative to apply a transfer function to the signal in the digital feedforward path 280 to correct, at least partially, error introduced by the power driver circuitry 250 and/or the load 260. As a further example, the digital correction element 284 may comprise both a digital gain element and an adaptive digital filter.

An output of the digital correction element 284 is coupled to an input of a second, digital, summing node 286, which is operative to add the digital feedforward signal to the digital signal output by the hybrid loop filter circuitry 230, such that the signal received by the digital PWM modulator circuitry 240 is a combination of the digital loop filter output signal output by the hybrid loop filter circuitry 230 and the digital feedforward signal output by the digital correction element 284.

The use of a hybrid loop filter in the PWM driver circuitry 200 facilitates the use of the digital PWM modulator circuitry 240 without requiring separate analog to digital converter circuitry between the hybrid loop filter circuitry 230 and the digital PWM modulator circuitry 240, and additionally permits the use of the digital feedforward path 280. The digital correction applied by the digital correction element 284 can be configured to model and compensate for errors introduced by the power driver circuitry 250 more accurately than the analog feedforward path 180 of the circuitry 100.

In examples in which the power driver circuitry 250 comprises MLC power driver circuitry, the use of a hybrid loop filter provides additional advantages. MLC power driver circuitry requires precise timing within the digital PWM modulator circuitry 240 for changing the PWM duty cycle and/or the operating mode of the power driver circuitry 250. The digital portion of a hybrid loop filter inherently has the required timing accuracy. Additionally, MLC power driver circuitry may have a signal dependent output impedance discontinuity. The use of a hybrid loop filter simplifies correction of, or compensation for, this non-behaviour.

Figure 3:
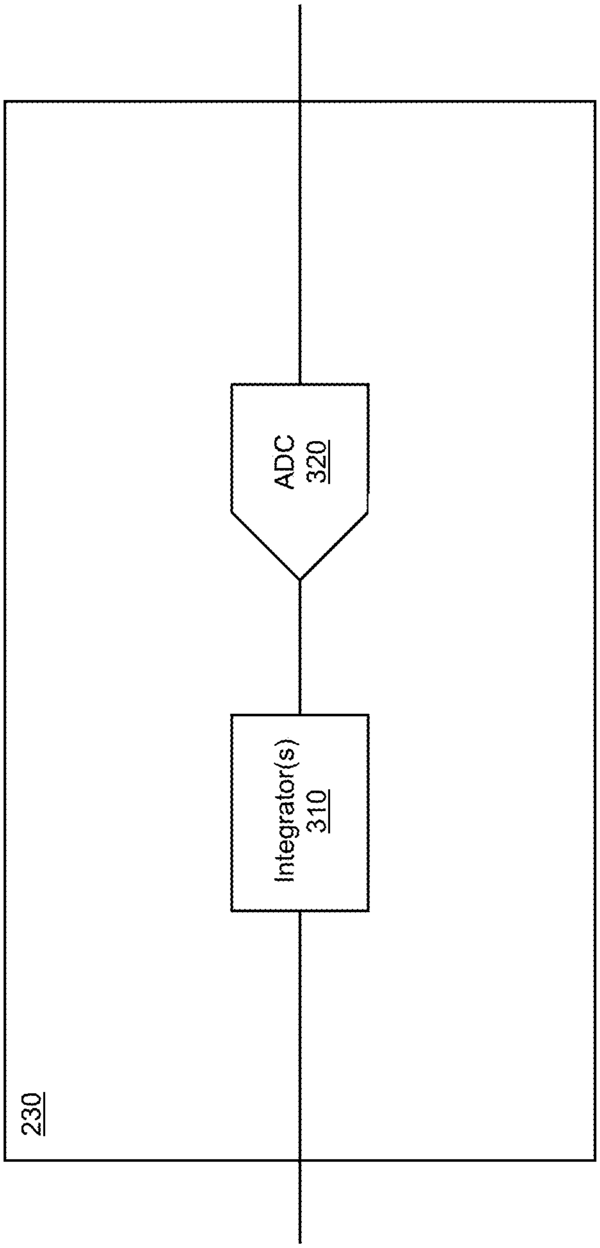
FIG. 3 is a schematic representation of a hybrid loop filter.

FIG. 3 is a schematic representation of the general structure of the hybrid loop filter circuitry 230 used in the PWM driver circuitry 200 of FIG. 2.

As shown in FIG. 3, the hybrid loop filter circuitry 230 includes at least one instance of analog integrator circuitry 310 and at least one instance of analog to digital converter (ADC) circuitry 320. The analog integrator circuitry 310 is configured to receive an analog input signal from the first analog summing node 220 and to output an analog integrated signal to the ADC circuitry 320. The ADC circuitry 320 is configured to receive the analog integrated signal from the analog integrator circuitry 310 and to output a digital version of the integrated signal as a digital loop filter output signal to the digital PWM modulator circuitry 240.

Figure 4:
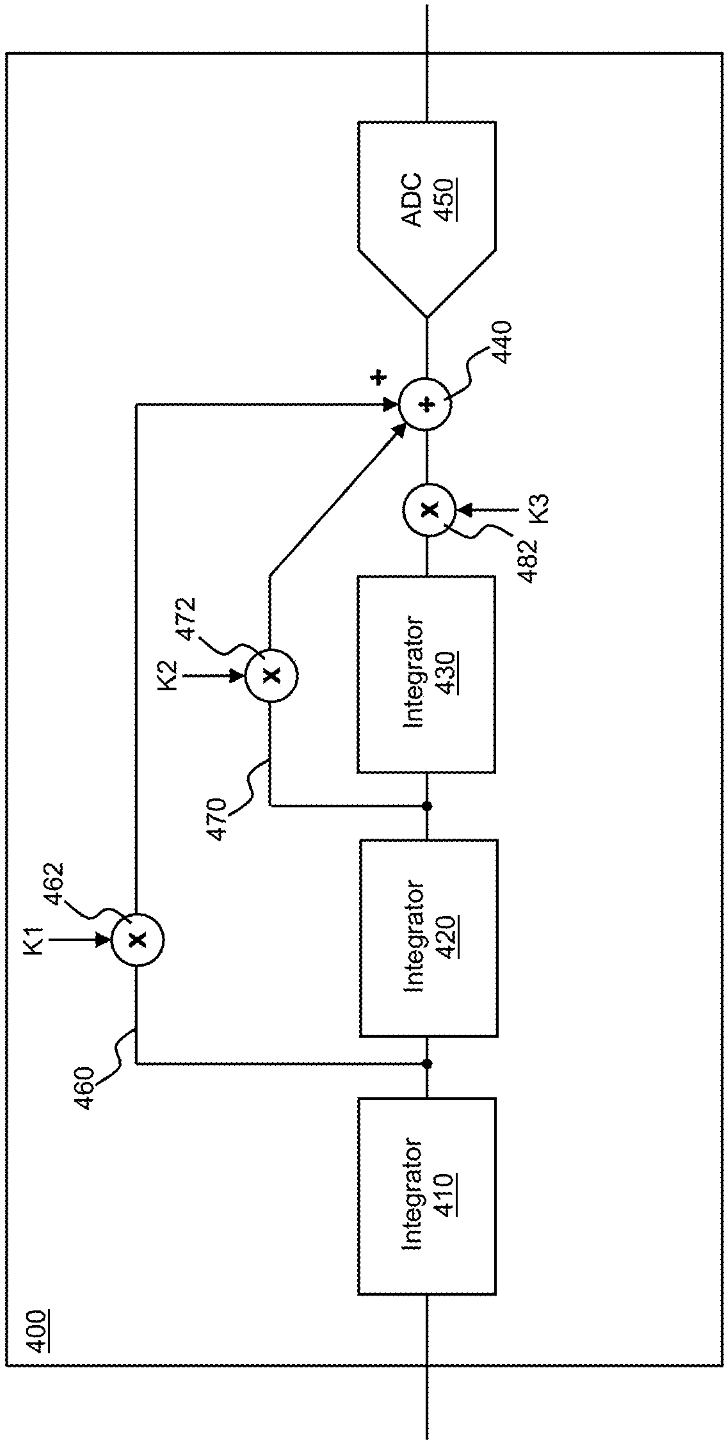
FIG. 4 is a schematic representation of an example hybrid loop filter.

FIG. 4 is a schematic representation of one example implementation of hybrid loop filter circuitry for use as the hybrid loop filter circuitry 230 in the PWM driver circuitry 200 of FIG. 2.

In this example, the hybrid loop filter circuitry (shown generally at 400 in FIG. 4) includes first, second and third analog integrator circuitry 410, 420, 430, an analog summing node 440 and ADC circuitry 450.

The first, second and third analog integrator circuitry 410-430 are coupled in series between an input of the hybrid loop filter circuitry 400 and a first input of the analog summing node 440. An output of the analog summing node 440 is coupled to an input of the ADC circuitry 450, the output of which is coupled to an output of the hybrid loop filter circuitry 400.

A first analog signal path 460 including a first analog gain element 462 is coupled at one end to a node between the first analog integrator circuitry 410 and the second analog integrator circuitry 420, and thus receives a first integrated analog signal from the first analog integrator circuitry 410. The other end of the first analog signal path 460 is coupled to a second input of the analog summing node 440. The first analog gain element 462 is configured to apply a first analog gain K1 to the signal in the first analog signal path 460.

A second analog signal path 470 including a second analog gain element 472 is coupled at one end to a node between the second analog integrator circuitry 420 and the third analog integrator circuitry 430, and thus receives a second integrated analog signal from the second analog integrator circuitry 420. The other end of the second analog signal path 470 is coupled to a third input of the analog summing node 440. The second analog gain element 472 is configured to apply a second analog gain K2 to the signal in the second analog signal path 470.

A third analog gain element 482 is provided between in a third analog signal path between the output of the third analog integrator circuitry 430 and the first input of the analog summing node 440 and is configured to apply a third analog gain K3 to the integrated analog signal output by the third analog integrator circuitry 430.

Thus, the analog summing node 440 receives a first scaled integrated signal from the first analog gain element 462, a second scaled integrated signal from the second analog gain element 472, and a third scaled integrated signal from the third analog gain element 482, and outputs a signal combining these signals to the ADC circuitry 450.

The ADC circuitry 450 is configured to convert the combined signal received at its input from the analog summing node 440 into a digital loop filter output signal for downstream processing in the PWM driver circuitry 200.

Figure 5:
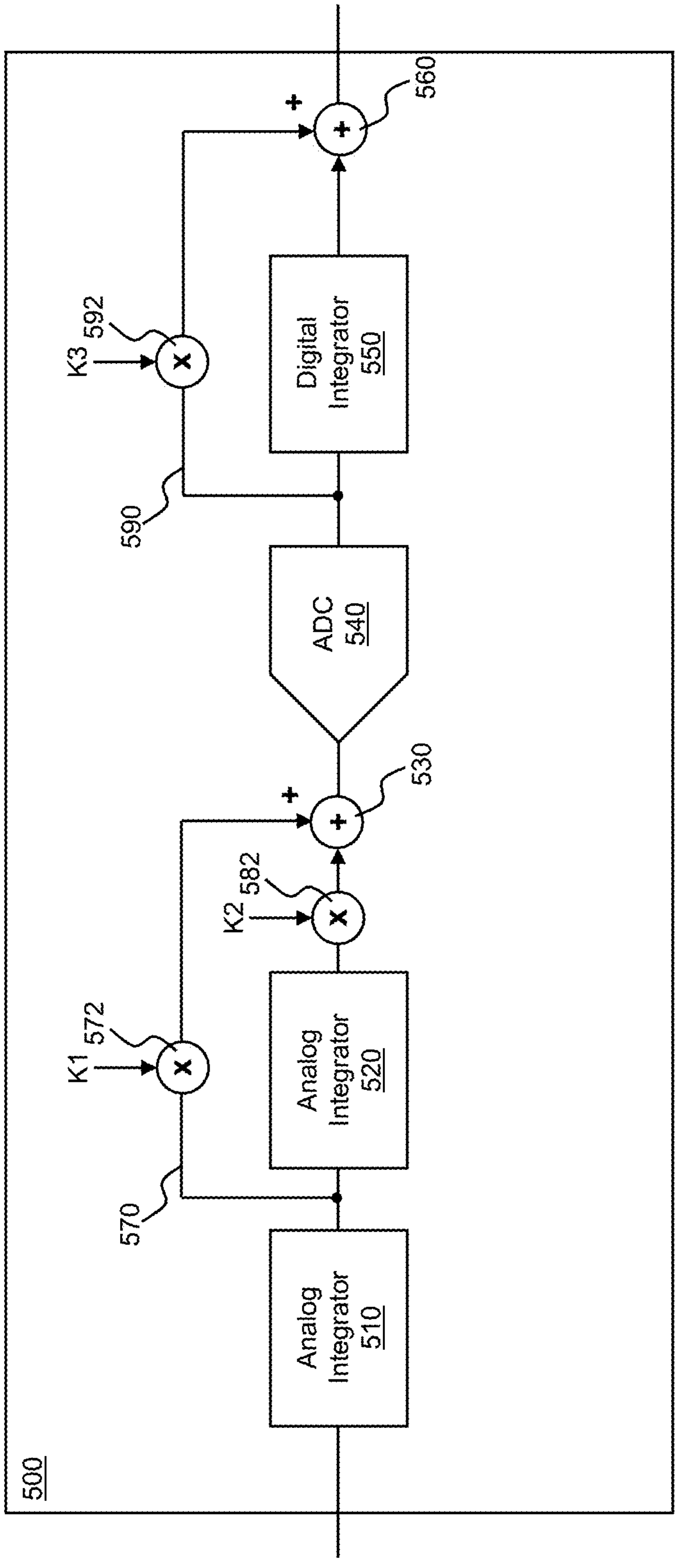
FIG. 5 is a schematic representation of a further example hybrid loop filter.

FIG. 5 is a schematic representation of an alternative example implementation of hybrid loop filter circuitry for use as the hybrid loop filter circuitry 230 in the PWM driver circuitry 200 of FIG. 2.

In this example, the hybrid loop filter circuitry (shown generally at 500 in FIG. 5) includes first and second analog integrator circuitry 510, 520, an analog summing node 530, ADC circuitry 540, digital integrator circuitry 550 and a digital summing node 560.

The first and second analog integrator circuitry 510, 520 are coupled in series between an input node of the hybrid loop filter circuitry 500 and a first input of the analog summing node 530. An output of the analog summing node is coupled to an input of the ADC circuitry 540, and the digital integrator circuitry 550 is coupled between to output of the ADC circuitry 540 so as to receive an intermediate digital output signal from the ADC circuitry 540. An output of the digital integrator circuitry 550 is coupled to a first input of the digital summing node 560. An output of the digital summing node 560 is coupled to an output node of the hybrid loop filter circuitry 500.

A first analog signal path 570 including a first analog gain element 572 is coupled at one end to a node between the first analog integrator circuitry 510 and the second analog integrator circuitry 520, and thus receives a first integrated analog signal from the first analog integrator circuitry 510. The other end of the first analog signal path 570 is coupled to a second input of the analog summing node 530. The first analog gain element 572 is configured to apply a first analog gain K1 to the signal in the first analog signal path 570.

A second analog gain element 582 is provided between in a second analog signal path between the output of the second analog integrator circuitry 520 and the first input of the analog summing node 530 and is configured to apply a second analog gain K2 to the signal output by the second analog integrator circuitry 520.

The analog summing node thus receives a first scaled integrated signal from the first analog gain element 572 and a second scaled integrated signal from the second analog gain element 582, and outputs an analog signal combining these signals to the ADC circuitry 540.

A digital signal path 590 including a digital gain element 592 is coupled at one end to a node between the output of the ADC circuitry 540 and the input of the digital integrator circuitry 550. The other end of the digital signal path 590 is coupled to a second input of the digital summing node 560. The digital gain element 592 is configured to apply a digital gain K2 to the signal in the digital signal path 590.

The digital summing node 560 thus receives a scaled version of the digital signal output by the ADC circuitry 540 and an integrated digital signal output by the digital integrator circuitry 550, and outputs a digital loop filter output signal combining these signals for downstream processing in the PWM driver circuitry 200.

Figure 6:
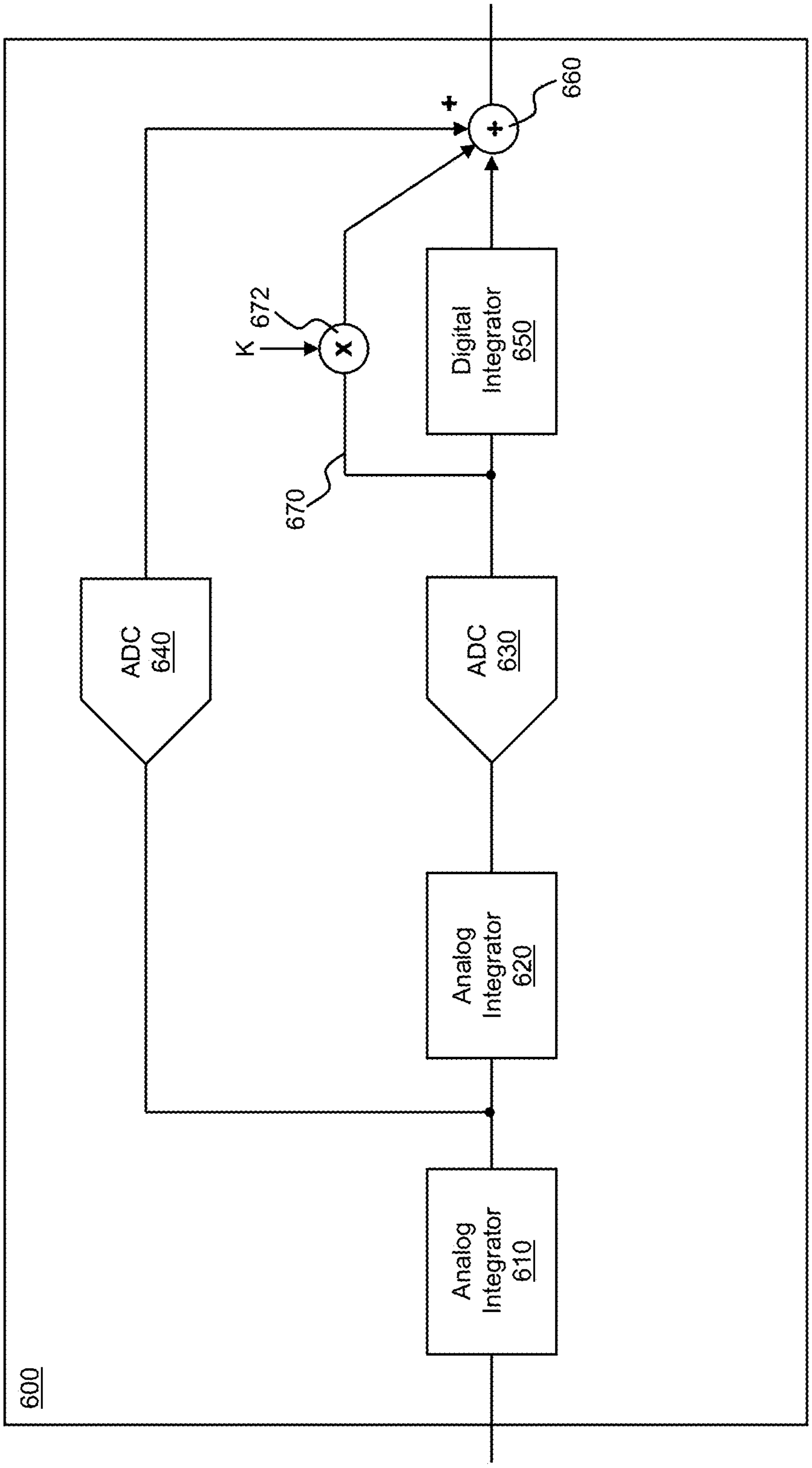
FIG. 6 is a schematic representation of a further example hybrid loop filter.

FIG. 6 is a schematic representation of a further alternative example implementation of hybrid loop filter circuitry for use as the hybrid loop filter circuitry 230 in the PWM driver circuitry 200 of FIG. 2.

In this example, the hybrid loop filter circuitry (shown generally at 600 in FIG. 6) includes first and second analog integrator circuitry 610, 620, first and second ADC circuitry 630, 640, digital integrator circuitry 650 and a digital summing node 660.

The first and second analog integrator circuitry 610, 620 are coupled in series between an input node of the hybrid loop filter circuitry 600 and an input of the first ADC circuitry 630. An input of the second ADC circuitry 640 is coupled to a node between the first analog integrator circuitry 610 and the second analog integrator circuitry 620. The digital integrator circuitry 650 is coupled between an output of the first ADC circuitry 630 and a first input of the digital summing node 660. An output of the second ADC circuitry 640 is coupled to a second input of the digital summing node 660.

A sampling rate of the ADC circuitry may differ between ADC paths in the hybrid loop filter circuitry 600. Thus, the sampling rate of the first ADC circuitry 630 may be different from the sampling rate of the second ADC circuitry 640. The sampling rate of the first ADC circuitry 630 may be selected, for example, based on an expected bandwidth of the integrated analog signal output by the first analog integrator circuitry 610. Similarly, the sampling rate of the second ADC circuitry 640 may be selected, for example, based on an expected bandwidth of the integrated analog signal output by the second analog integrator circuitry 620. Using different sampling rates in this way may have the effect of increasing the accuracy of the analog to digital conversion process and thus increasing the accuracy of the digital signals output by the ADC circuitry 630, 640.

One end of a digital signal path 670 containing a digital gain element 672 is coupled to a node between the output of the first ADC circuitry 630 and a third input of the digital summing node 660. The digital gain element 672 is configured to apply a digital gain K to the signal in the digital signal path 670.

An output of the digital summing node 660 is coupled to an output node of the hybrid loop filter circuitry 600.

The digital summing node 660 thus receives a scaled version of the digital signal output by the first ADC circuitry 630 and an integrated digital signal output by the digital integrator circuitry 650, and outputs a digital signal combining these signals for downstream processing in the PWM driver circuitry 200.

Figure 7:
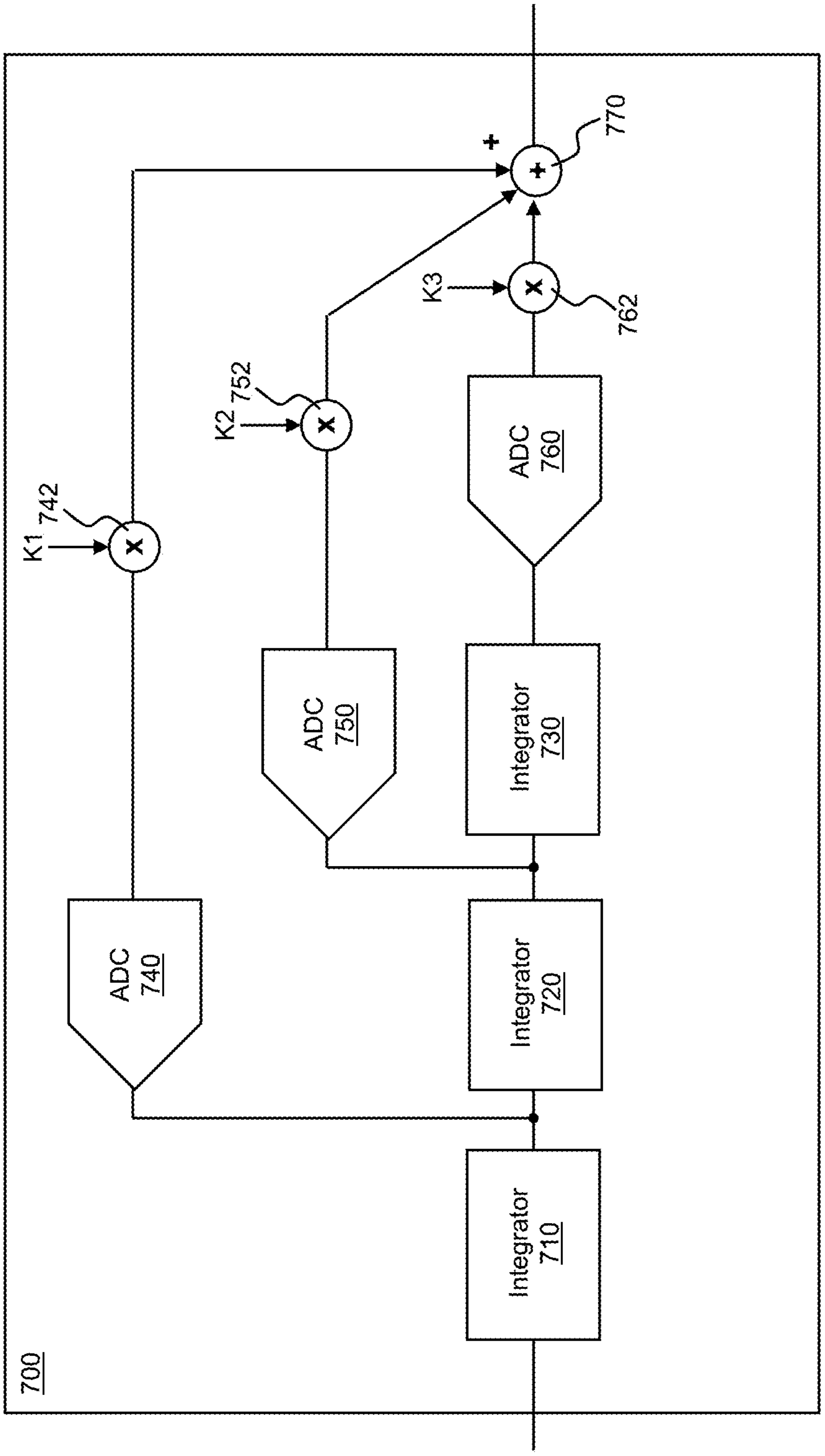
FIG. 7 is a schematic representation of a further example hybrid loop filter.

FIG. 7 is a schematic representation of a further alternative example implementation of hybrid loop filter circuitry for use as the hybrid loop filter circuitry 230 in the PWM driver circuitry 200 of FIG. 2.

In this example, the hybrid loop filter circuitry (shown generally at 700 in FIG. 7) includes first, second and third analog integrator circuitry 710, 720, 730, first, second and third ADC circuitry 740, 750, 760 and a digital summing node 770.

The first, second and third analog integrator circuitry 710, 720, 730 are coupled in series between an input node of the hybrid loop filter circuitry 700 and an input of the third ADC circuitry 760.

An input of the first ADC circuitry 740 is coupled to a node between the first analog integrator circuitry 710 and the second analog integrator circuitry 720. An input of the second ADC circuitry 750 is coupled to a node between the second analog integrator circuitry 720 and the third analog integrator circuitry 730. An input of the third ADC circuitry 760 is coupled to an output of the third analog integrator circuitry 730.

An output of the first ADC circuitry 740 is coupled to an input of a first digital gain element 742. An output of the first digital gain element 742 is coupled to a first input of the digital summing node 770. The first digital gain element 742 is configured to apply a first digital gain K1 to the digital signal output by the first ADC circuitry 740.

An output of the second ADC circuitry 750 is coupled to an input of a second digital gain element 752. An output of the second digital gain element 752 is coupled to a second input of the digital summing node 770. The second digital gain element 752 is configured to apply a second digital gain K2 to the digital signal output by the second ADC circuitry 750.

An output of the third ADC circuitry 760 is coupled to an input of a third digital gain element 762. An output of the third digital gain element 762 is coupled to a third input of the digital summing node 770. The third digital gain element 762 is configured to apply a third digital gain K3 to the digital signal output by the third ADC circuitry 760.

Thus, the digital summing node 770 receives respective first, second and third scaled digital versions of the integrated signals output by the first, second and third analog integrator circuitry 710, 720, 730, and outputs a digital signal combining these signals for downstream processing in the PWM driver circuitry 200.

A sampling rate of the ADC circuitry may differ between ADC paths in the hybrid loop filter circuitry 700. Thus, the sampling rate of the first ADC circuitry 740 may be different from the sampling rate of the second ADC circuitry 750, which may in turn be different from the sampling rate of the third ADC circuitry 760. The sampling rates of the first, second and third ADC circuitry 740, 750, 760 may be selected, for example, based on an expected bandwidth of the integrated analog signals output by the first, second and third analog integrator circuitry 710. 720, 730 respectively. Using different sampling rates in this way may have the effect of increasing the accuracy of the analog to digital conversion process and thus increasing the accuracy of the digital signals output by the ADC circuitry 740, 750, 760.

Figure 8:
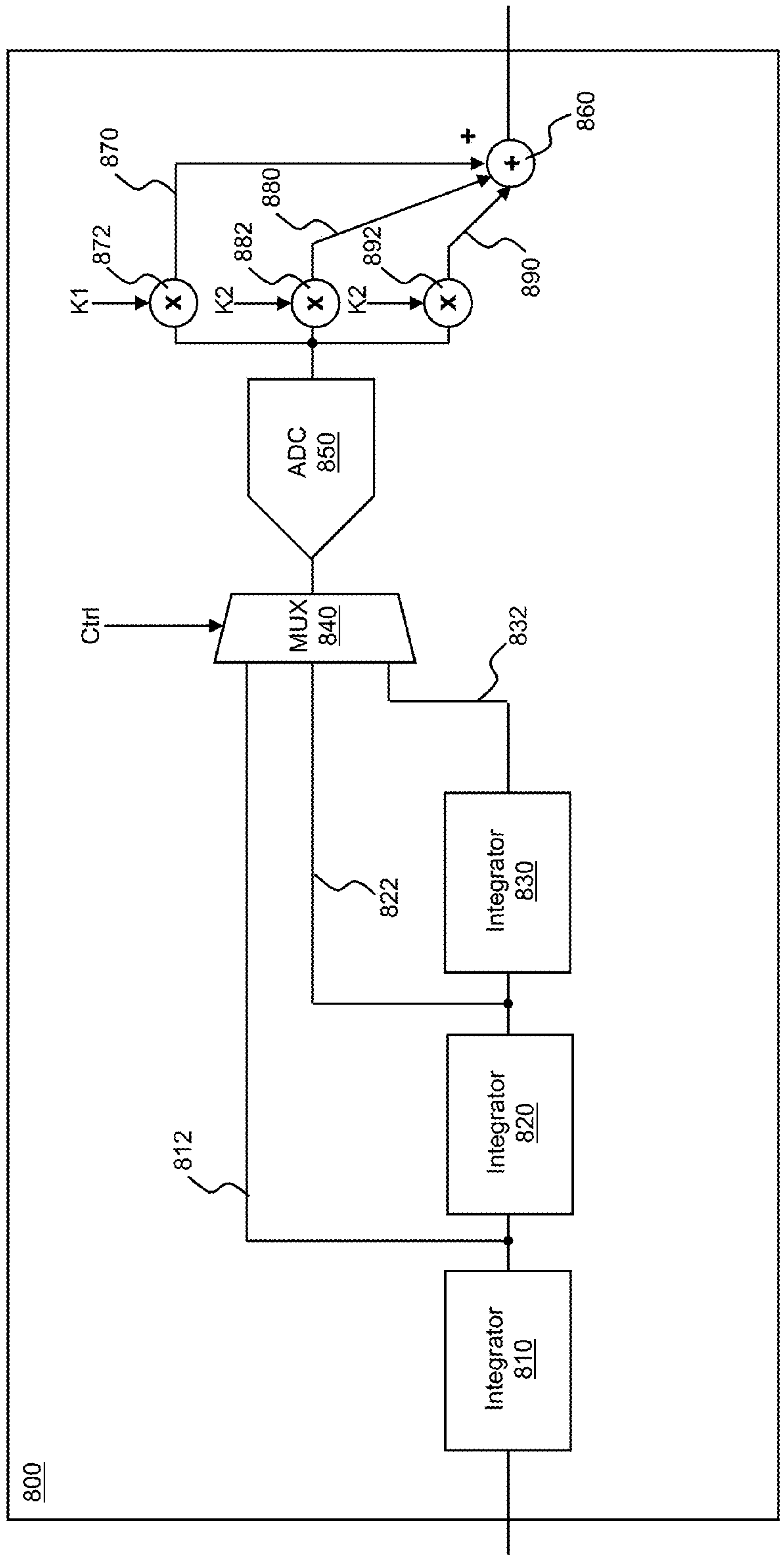
FIG. 8 is a schematic representation of a further example hybrid loop filter.

FIG. 8 is a schematic representation of a further alternative example implementation of hybrid loop filter circuitry for use as the hybrid loop filter circuitry 230 in the PWM driver circuitry 200 of FIG. 2.

In this example, the hybrid loop filter circuitry (shown generally at 800 in FIG. 8) includes first, second and third analog integrator circuitry 810, 820, 830, analog multiplexer circuitry 840, ADC circuitry 850 and a digital summing node 860.

An input of the first analog integrator circuitry 810 is coupled to an input node of the hybrid loop filter circuitry 800. An output of the first analog integrator circuitry 810 is coupled to an input of the second analog integrator circuitry 820, and to a first analog signal path 812 that couples the output of the first analog integrator circuitry 810 to a first input of the multiplexer circuitry 840.

An output of the second analog integrator circuitry 820 is coupled to an input of the third analog integrator circuitry 830, and to a second analog signal path 822 that couples the output of the second analog integrator circuitry 820 to a second input of the multiplexer circuitry 840.

An output of the third analog integrator circuitry 830 is coupled to a third analog signal path 832 that couples the output of the third analog integrator circuitry 830 to a third input of the multiplexer circuitry 840.

An output of the analog multiplexer circuitry 840 is coupled to an input of the ADC circuitry 850.

The ADC circuitry 850 is configured to convert the analog signal output by the multiplexer circuitry 840 into a digital signal which is output to the digital summing node 860. An output of the ADC circuitry 850 is coupled to first, second and third digital signal paths 870, 880, 890, which are each coupled to a respective input of the digital summing node 860.

An output of the digital summing node 860 is coupled to an output node of the hybrid loop filter circuitry 800.

The first digital signal path 870 includes a first digital gain element 872 configured to apply a first digital gain K1 to a digital signal output by the ADC circuitry 850. Similarly, the second digital signal path 880 includes a second digital gain element 882 configured to apply a second digital gain K2 to the signal output by the ADC circuitry 850, and the third digital signal path 890 includes a third digital gain element 892 configured to apply a third digital gain K3 to the signal output by the ADC circuitry 850.

The multiplexer circuitry 840 is configured to receive a control signal Ctrl and selectively couple its output to one of its inputs based on the control signal Ctrl. In some examples the multiplexer circuitry 840 is operative to select between its input signals on a time division basis, such that each input of the multiplexer circuitry 840 is selected for an equal amount of time in a given period. For example, for a frame comprising three periods of the clock signal CLK, the analog multiplexer circuitry 840 may be operative to select the first input signal during a first clock period, select the second input signal during a second clock period, and select the third input signal during a third clock period.

The control signal Ctrl (or another control signal) may also be received by control elements such as switches (not shown in FIG. 8) of the first, second and third digital signal paths 870, 880, 890, and used to select the digital signal path 870, 880, 890 corresponding to the input selected by the multiplexer circuitry.

Thus, when the multiplexer circuitry 840 selects its first input such that the signal in the first analog signal path 812 is output to the ADC circuitry 840, the first digital signal path 870 may be selected and/or enabled (and the second and third digital signal paths 880, 890 may be deselected and/or disabled) such that the first digital gain K1 is applied to the digital signal output by the ADC circuitry 850 and the resulting scaled digital signal is received at the first input of the digital summing node 860. Similarly, when the multiplexer circuitry 840 selects its second input such that the signal in the second analog signal path 822 is output to the ADC circuitry 840, the second digital signal path 880 may be selected and/or enabled (and the first and third digital signal paths 870, 890 may be deselected and/or disabled) such that the second digital gain K2 is applied to the digital signal output by the ADC circuitry 850 and the resulting scaled digital signal is received at the second input of the digital summing node 860. When the multiplexer circuitry 840 selects its third input such that the signal in the third analog signal path 832 is output to the ADC circuitry 840, the third digital signal path 890 may be selected and/or enabled (and the first and second digital signal paths 880, 890 may be deselected and/or disabled) such that the third digital gain K3 is applied to the digital signal output by the ADC circuitry 850 and the resulting scaled digital signal is received at the third input of the digital summing node 860.

The sampling rate of the ADC circuitry 850 may be variable according to which input of the multiplexer circuitry 840 is selected. For example, when the multiplexer circuitry 840 selects its first input such that the signal in the first analog signal path 812 is output to the ADC circuitry 840, the ADC circuitry 850 may operate with a first sampling rate, which may be based on an expected bandwidth of the integrated analog signal output by the first analog integrator circuitry 810. Similarly, when the multiplexer circuitry 840 selects its second input such that the signal in the second analog signal path 822 is output to the ADC circuitry 840, the ADC circuitry 850 may operate with a second sampling rate, which may be based on an expected bandwidth of the integrated analog signal output by the second analog integrator circuitry 820, and when the multiplexer circuitry 840 selects its third input such that the signal in the third analog signal path 832 is output to the ADC circuitry 840, the ADC circuitry 850 may operate with a third sampling rate, which may be based on an expected bandwidth of the integrated analog signal output by the third analog integrator circuitry 830. Using different ADC sample rates depending on which analog signal path 812, 822, 832 is selected by the multiplexer circuitry 840 in this way may have the effect of increasing the accuracy of the analog to digital conversion process performed by the ADC circuitry 850.

(It will be appreciated by those of ordinary skill in the art that in other examples the hybrid loop filter circuitry 800 could include only the first and second analog integrator circuitry 810, 820, or could include more than three instances of analog integrator circuitry. In either case, the output of each instance of analog integrator circuitry is coupled to a respective different input of the multiplexer circuitry 840, and the control signal Ctrl may be used by the multiplexer circuitry 840 to select one of its inputs, and to select a digital signal path corresponding to the selected input to the multiplexer circuitry 840).

The digital summing node 860 is configured to combine the digital signals received from the ADC circuitry 850 via the digital signal paths 870, 880, 890 over a given period of time and to output an output signal representative of the combined digital signals at the end of the given period of time. For example, for a frame comprising three periods of the clock signal, the digital summing node 860 may be operative to add a value of the digital signal received from the ADC circuitry 850, via the first digital signal path 870 during the first clock period, a value of the digital signal received from the ADC circuitry 850, via the second digital signal path 880, during the second clock period and a value of the digital signal received from the ADC circuitry 850, via the third digital signal path 890, during the third clock period, and to output the output signal at the end of the third clock period.

Thus, in this example the digital summing node 860 receives, over the course of a frame, respective first, second and third scaled digital versions of the integrated signals output by the first, second and third analog integrator circuitry 810, 820, 830, and at the end of the frame, outputs a digital signal combining these signals for downstream processing in the PWM driver circuitry 200.

In the hybrid loop filter arrangements described above with reference to FIGS. 2-8, the ADC circuitry (e.g., ADC circuitry 320, 450, 540, 630, 640, 740-760, 850) may be oversampling ADC circuitry, to improve the resolution and dynamic range of the ADC circuitry.

The sampling rate of the ADC circuitry of the above-described hybrid loop filter arrangements (e.g., ADC circuitry 320, 450, 540, 630, 640, 740-760, 850) may be greater than an output rate of the circuitry in which the hybrid loop filter is employed. For example, the sampling rate of the ADC circuitry 320, 450, 540, 630, 640, 740-760, 850 may be greater than an output rate of the digital PWM modulator circuitry 240 in the PWM driver circuitry 200 of FIG. 2.

The hybrid loop filter arrangements described above with reference to FIGS. 2-8 are configurable to correct or compensate for a wide range of factors that may affect the behaviour of the circuitry in which the hybrid loop filter is employed, such as variations to component and/or circuit characteristics or parameters that arise as a result of, e.g., process variations, component tolerances, ageing, derating, or environmental effects such as temperature and the like.

As noted above, the hybrid loop filter described above with reference to FIGS. 3-8 may be used in a variety of applications, e.g., in PWM-based Class D audio power amplifier circuitry, PWM based motor controller circuitry, PWM-based power converter circuitry (e.g., DC-DC converter circuitry), and thus the present disclosure is not limited to any particular application of the hybrid loop filter circuitry. Moreover, although in the examples of FIGS. **2*a*-8** the hybrid loop filter is described as being suitable for use as the hybrid loop filter circuitry for PWM driver circuitry, it will be appreciated by those of ordinary skill in the art that the hybrid loop filter circuitry may be used in other circuitry that employs a loop filter and is thus not limited to use in PWM driver circuitry.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Driver circuitry comprising:

a loop filter configured to receive an analog input signal and to output a digital loop filter output signal based on the analog input signal and an analog feedback signal; and a modulator configured to receive a digital signal based on the digital loop filter output signal and to output a modulated signal, wherein the driver circuitry further comprises a feedback path coupled to an output of the driver circuitry for the analog feedback signal.

2. Driver circuitry according to claim 1, further comprising a digital feedforward path configured to receive a digital input signal and to output a digital feedforward signal, wherein the digital signal received by the modulator is based on the digital loop filter output signal and the digital feedforward signal.

3. Driver circuitry according to claim 1, further comprising a power driver configured to receive the modulated signal output by the modulator and to generate a drive signal for driving a load coupled to the driver circuitry.

4. Driver circuitry according to claim 3, wherein an output of the power driver is coupled to the output of the driver circuitry, such that the feedback path for the analog feedback signal receives the drive signal.

5. Driver circuitry according to claim 3, wherein the power driver comprises multi-level converter (MLC) circuitry.

6. Driver circuitry according to claim 3, further comprising a digital feedforward path configured to receive a digital input signal and to output a digital feedforward signal, wherein the digital signal received by the modulator signal is based on the digital loop filter output signal and the digital feedforward signal, wherein the digital feedforward path comprises a digital correction element configured to apply a correction to a signal in the digital feedforward path to correct or compensate, at least partially, for error introduced by the power driver and/or the load.

7. Driver circuitry according to claim 6, wherein the digital correction element comprises one or more of:

a digital gain element for applying a digital gain to the signal in the digital feedforward path; and an adaptive digital filter.

8. Driver circuitry according to claim 1, wherein the driver circuitry further comprises input digital to analog converter (DAC) circuitry configured to receive a digital input signal and to output the analog input signal to the loop filter.

9. Driver circuitry according to claim 1, wherein the loop filter comprises analog integrator circuitry and analog to digital converter circuitry.

10. Driver circuitry according to claim 9, wherein the loop filter comprises:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

third analog integrator circuitry having an input coupled to an output of the second analog integrator circuitry, the third analog integrator circuitry configured to output a third integrated analog output signal;

a first analog signal path having an input coupled to the output of the first analog integrator circuitry, the first analog signal path comprising a first analog correction element;

a second analog signal path having an input coupled to the output of the second analog integrator circuitry, the second analog signal path comprising a second analog correction element;

a third analog signal path having an input coupled to the output of the third analog integrator circuitry, the third analog signal path comprising a third analog correction element;

an analog summing node configured to receive output signals of the first, second and third analog signal paths and to output a combined analog output signal; and analog to digital converter circuitry coupled to an output of the analog summing node and configured to convert the combined analog output signal into the digital loop filter output signal.

11. Driver circuitry according to claim 9, wherein the loop filter further comprises digital integrator circuitry.

12. Driver circuitry according to claim 11, wherein the loop filter comprises:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

a first analog signal path having an input coupled to the output of the first analog integrator circuitry, the first analog signal path comprising a first analog correction element;

a second analog signal path having an input coupled to an output of the second analog integrator circuitry, the second analog signal path comprising a second analog correction element;

an analog summing node configured to receive output signals of the first and second analog signal paths and to output a combined analog output signal;

analog to digital converter (ADC) circuitry coupled to an output of the analog summing node and configured to convert the combined analog output signal into an intermediate digital output signal;

digital integrator circuitry coupled to an output of the ADC circuitry to receive the intermediate digital output signal, the digital integrator circuitry configured to output an integrated digital signal;

a digital signal path having an input coupled to the output of the ADC circuitry, the digital signal path comprising a digital correction element; and a digital summing node configured to combine the integrated digital signal with an output signal from the digital signal path to generate the digital loop filter output signal.

13. Driver circuitry according to claim 11, wherein the loop filter comprises:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

first analog to digital converter (ADC) circuitry having an input coupled to the output of the second analog integrator circuitry;

second analog to digital converter (ADC) circuitry having an input coupled to an output of the first analog integrator circuitry;

digital integrator circuitry configured to receive a digital signal output by the first ADC circuitry and to output an integrated digital signal;

a digital signal path having an input coupled to an output of the first ADC circuitry, the digital signal path comprising a digital correction element; and a digital summing node configured to combine the integrated digital signal with an output signal from the digital signal path to generate the digital loop filter output signal.

14. Driver circuitry according to claim 13, wherein a sampling rate of the first ADC circuitry is different from a sampling rate of the second ADC circuitry.

15. Driver circuitry according to claim 9, wherein the loop filter comprises:

first analog integrator circuitry configured to receive the analog input signal and to output a first integrated analog output signal;

second analog integrator circuitry having an input coupled to an output of the first analog integrator circuitry, the second analog integrator circuitry configured to output a second integrated analog output signal;

third analog integrator circuitry having an input coupled to an output of the second analog integrator circuitry, the third analog integrator circuitry configured to output a third integrated analog output signal;

first analog to digital converter (ADC) circuitry having an input coupled to the output of the first analog integrator circuitry;

second analog to digital converter (ADC) circuitry having an input coupled to the output of the second analog integrator circuitry;

third analog to digital converter (ADC) circuitry having an input coupled to an output of the first analog integrator circuitry;

a first digital signal path having an input coupled to the output of the first ADC circuitry, the first digital signal path comprising a first digital correction element;

a second digital signal path having an input coupled to the output of the second ADC circuitry, the second digital signal path comprising a second digital correction element;

a third digital signal path having an input coupled to the output of the third ADC circuitry, the third digital signal path comprising a third digital correction element; and a digital summing node configured to combine output signals of the first, second and third digital signal paths to generate the digital loop filter output signal.

16. Driver circuitry according to claim 15, wherein a sampling rate of the first ADC circuitry is different from a sampling rate of the second ADC circuitry, and/or wherein the sampling rate of the second ADC circuitry is different from a sampling rate of the third ADC circuitry.

17. Driver circuitry according to claim 9, wherein the loop filter comprises:

first analog integrator circuitry;

second analog integrator circuitry;

multiplexer circuitry having inputs coupled to outputs of the first and second analog integrator circuitry;

analog to digital converter (ADC) circuitry having an input coupled to an output of the multiplexer circuitry;

a first digital signal path comprising a first digital correction element coupled to the output of the ADC circuitry;

a second digital signal path comprising a second digital correction element coupled to the output of the ADC circuitry; and a digital summing node configured to combine output signals of the first and second digital signal paths and output a combined digital signal.

18. Driver circuitry according to claim 17, wherein a sampling rate of the ADC circuitry is variable based on which of the inputs of the multiplexer circuitry is selected by the multiplexer circuitry.

19. Driver circuitry according to claim 1, wherein the modulator comprises a pulse width modulator.

20. An integrated circuit comprising driver circuitry according to claim 1.

21. A host device comprising driver circuitry according to claim 1.

22. A host device according to claim 21, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

23. Driver circuitry comprising:

a loop filter configured to receive an analog input signal and to output a digital loop filter output signal; and a pulse width modulation (PWM) modulator configured to receive a digital signal based on the digital loop filter output signal and to output a PWM signal, wherein the loop filter comprises an analog integrator and a digital integrator.

24. Driver circuitry comprising:

a loop filter configured to receive an analog input signal and to output a digital loop filter output signal; and a modulator configured to receive a digital signal based on the digital loop filter output signal and to output a modulated signal, wherein the loop filter comprises:

an analog integrator; and an analog to digital converter (ADC), herein a sampling rate of the ADC is greater than an output rate of the driver circuitry.

* * * * *